United States Patent
Richieri et al.

(10) Patent No.: US 8,039,328 B2
(45) Date of Patent: Oct. 18, 2011

(54) TRENCH SCHOTTKY DEVICE WITH SINGLE BARRIER

(75) Inventors: Giovanni Richieri, Turin (IT); Rossano Carta, Turin (IT)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 11/582,289

(22) Filed: Oct. 17, 2006

(65) Prior Publication Data
US 2007/0087493 A1    Apr. 19, 2007

Related U.S. Application Data

(60) Provisional application No. 60/727,712, filed on Oct. 18, 2005.

(51) Int. Cl.
*H01L 21/338* (2006.01)

(52) U.S. Cl. . 438/167; 438/570; 438/534; 257/E21.351; 257/E21.359

(58) Field of Classification Search ............ 438/456, 438/570–582, 534, 169, 167; 257/E29.338, 257/E21.047, E21.064, E21.351, E21.359
See application file for complete search history.

(56) References Cited

U.S. PATENT DOCUMENTS

| | | | | |
|---|---|---|---|---|
| 4,398,344 A | * | 8/1983 | Gould | 438/121 |
| 5,365,102 A | * | 11/1994 | Mehrotra et al. | 257/475 |
| 2002/0179993 A1 | * | 12/2002 | Hshieh et al. | 257/471 |

FOREIGN PATENT DOCUMENTS

CN    1520615 A    8/2004

* cited by examiner

Primary Examiner — Matthew Reames
(74) Attorney, Agent, or Firm — Farjami & Farjami LLP

(57) ABSTRACT

A process for forming a trench Schottky barrier device includes the forming of an oxide layer within the trenches in the surface of a silicon wafer, and then depositing a full continuous metal barrier layer over the full upper surface of the wafer including the trench interiors and the mesas between trenches with a barrier contact made to the mesas only. Palladium, titanium or any conventional barrier metal can be used.

11 Claims, 1 Drawing Sheet

TRENCH SCHOTTKY DEVICE WITH SINGLE BARRIER

RELATED APPLICATION

This application is based on and claims the benefit of U.S. Provisional Application Ser. No. 60/727,712, filed on Oct. 18, 2005, entitled TRENCH SCHOTTKY DEVICE WITH SINGLE BARRIER, to which a claim of priority is hereby made and the disclosure of which is incorporated by reference.

FIELD OF THE INVENTION

This invention relates to semiconductor devices and more specifically relates to trench Schottky devices and processes for their manufacture.

BACKGROUND OF THE INVENTION

Trench Schottky devices are well known and are shown, for example, in U.S. Pat. No. 6,855,593 entitled Trench Schottky Barrier Diode in the names of Andoh and Chiola (IR-1663). Planar Schottky devices are also well known and are shown in U.S. Pat. No. 4,398,344 in the name of Gould (IR-659).

The manufacture of the trench Schottky is complicated by the need for extra process steps required to ensure that the barrier metal on the tops of the mesas formed by the trenches is removed from the trench walls.

It would be desirable to provide such a process but having fewer process steps without affecting the final device characteristics.

BRIEF DESCRIPTION OF THE INVENTION

In accordance with the invention, spaced trenches are formed in a silicon substrate and an oxide layer is thermally grown on the full upper surface and on the trench side walls. The oxide layer is then removed from the tops of the mesas, and a barrier metal which adheres to both oxide and silicon is then deposited, as by sputtering on the full upper surface of the wafer (or die), adhering to the exposed silicon surface at the tops of the mesas, forming the desired Schottky barrier, and adhering to the oxide layer on the walls and bottom of the trenches. Metals which can be used are, for example, titanium and palladium. The process used to form the barrier metal may be that described in Gould U.S. Pat. No. 4,398,344 previously referred.

The dimensions used for the trench depth and width and for the mesa width may be those described in U.S. Pat. No. 6,855,593 described above.

DETAILED DESCRIPTION OF THE DRAWINGS

Figure 1:
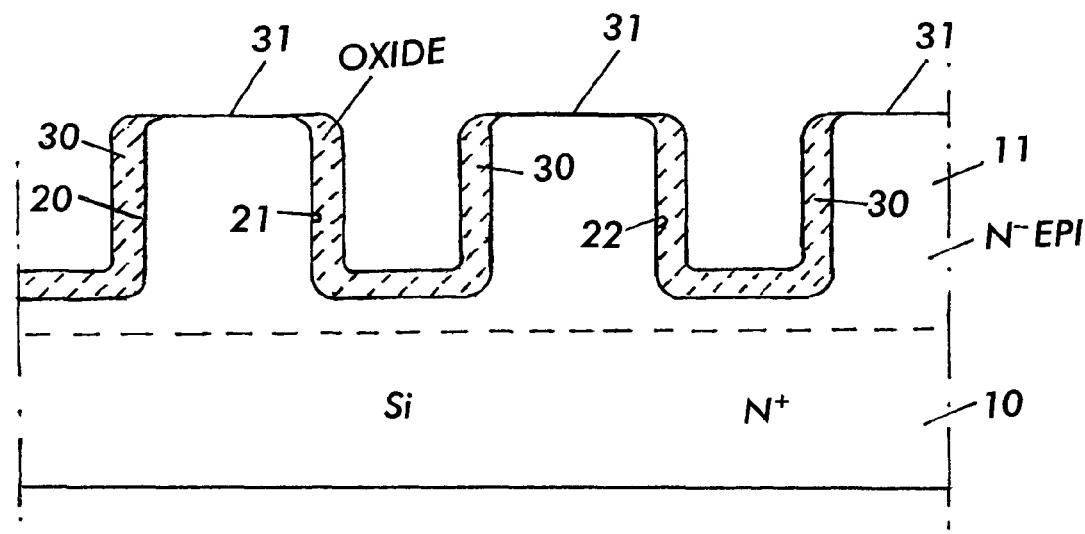
FIG. 1 is a cross-section of a small portion of a wafer (or die) after the formation of parallel trenches, the oxidation of the upper surface of the wafer and the removal of the oxide from the tops of the mesas.

Referring first to FIG. 1, there is shown a silicon wafer (or die) 10 which is of monocrystalline silicon of the N+ conductivity type, and which may have an upper epitaxially formed surface layer 11. The top of the wafer receives a plurality of identical trenches 20, 21, 22 in the epitaxially formed layer 11.

In an early process step, the full upper surface of the wafer 10 has a thermal oxide 30 grown thereon, over the full interior of each trench and over the mesas between the trenches. The oxide 30 is then suitably removed from the tops 31 of the mesas. Alternatively, the masks used during the trench etch process may be left in place to block the growth of oxide on the mesas.

Figure 2:
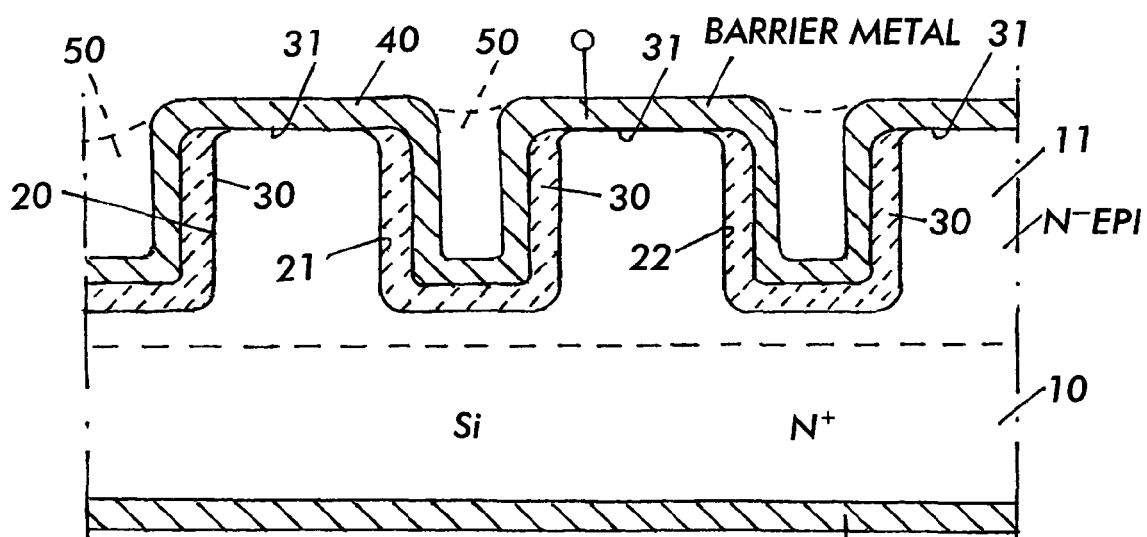
FIG. 2 shows the wafer of FIG. 1 after the deposition of a barrier metal over the entire wafer surface, but in contact with only the tops of the mesas.

The wafer is then suitably cleaned, and a Schottky-forming barrier metal 40 (FIG. 2) is then applied, as by sputtering over the fully unmasked active surface of the wafer. The barrier metal chosen is one which will adhere to silicon to form the Schottky barrier at the tops 31 of the mesas, and which will also adhere to the oxide 30 within the trenches. Thus, the metal 40 is insulated from the interior walls and bottoms of trenches 20, 21 and 22.

Barrier metals which can be used are, for example, titanium and palladium; and the like are described in U.S. Pat. No. 4,398,344 referred to above.

Thereafter, the trench interiors can be filled with any suitable filler 50 to planarize the upper surface of the device.

Top and bottom electrodes can then be attached to the top and bottom respectively of the wafer. Bottom electrode 50 is shown attached to the bottom of N+ wafer 10.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A process for forming a trench Schottky device comprising the steps of forming parallel trenches into the upper surface of an N-type silicon wafer, said trenches being spaced by N-type mesas;

covering inner walls and bottom of each of said trenches with a layer of thermal oxide;

applying a continuous Schottky barrier metal layer that is capable of adhering to silicon and thermal oxide over and in Schottky contact with tops of said mesas and directly on said thermal oxide covering said sidewalls and bottom of said trenches leaving space in the interior of each said trench whereby said continuous Schottky barrier metal layer defines a Schottky barrier to said silicon wafer, filling said spaces in each said trench with a filler, each filler having a top portion that does not extend above said Schottky barrier layer over said tops of said mesas, and applying contact to bottom of said wafer.

2. The process of claim 1, wherein the upper portion of said wafer is an epitaxially formed layer of silicon; said trenches being formed in said epitaxially formed layer.

3. The process of claim 1, wherein said covering step includes thermally growing said thermal oxide followed by removal of said thermal oxide from tops of said mesas.

4. The process of claim 1, wherein said continuous Schottky barrier metal layer is comprised of one of titanium or palladium.

5. A method of manufacturing a trench Schottky device in a semiconductor wafer including a plurality of trenches with a plurality of walls and a bottom, said semiconductor wafer further including at least one mesa with a top, and said semiconductor wafer further including a bottom, said method comprising the following steps:

forming an insulating layer covering said plurality of walls and said bottom of said plurality of trenches;

forming an adhesion/barrier layer over said insulating layer, said adhesion/barrier layer in Schottky contact with said tops of said mesas and said insulating layer;

covering said adhesion/barrier layer with a filler, wherein said filler has a top portion that does not extend above said adhesion/barrier layer.

6. The method of claim 5, wherein said semiconductor wafer substantially comprises silicon.

7. The method of claim 5, wherein said semiconductor wafer substantially comprises epitaxially grown silicon.

8. The method of claim 5, further comprising applying a contact to said bottom of said semiconductor wafer.

9. The method of claim 5, wherein said adhesion/barrier layer substantially comprises a material selected from the group consisting of titanium and palladium.

10. The method of claim 5, wherein said insulating layer substantially comprises a thermal oxidation layer.

11. The method of claim 5, wherein said step of forming said insulating layer comprises:

forming said insulating layer by thermal oxidation;
removing portions of said insulating layer from said tops of said mesas.

* * * * *